(12) United States Patent
Cobb et al.

(10) Patent No.: US 7,434,199 B2
(45) Date of Patent: Oct. 7, 2008

(54) DENSE OPC

(76) Inventors: Nicolas Bailey Cobb, 1496 Flamingo Way, Sunnyvale, CA (US) 94087; Dragos Dudau, 19500 Pruneridge Ave., Apt. 3209, Cupertino, CA (US) 95014

( * ) Notice: Subject to any disclaimer, the term of this patent is extended or adjusted under 35 U.S.C. 154(b) by 401 days.

(21) Appl. No.: 11/236,208

(22) Filed: Sep. 27, 2005

(65) Prior Publication Data
US 2007/0074143 A1    Mar. 29, 2007

(51) Int. Cl.
*G06F 17/50* (2006.01)
(52) U.S. Cl. .................... 716/21; 716/7; 716/19
(58) Field of Classification Search ............ 716/21, 716/19, 7; 430/5; 700/120, 121; 378/35
See application file for complete search history.

(56) References Cited

U.S. PATENT DOCUMENTS

| | | | |
|---|---|---|---|
| 4,532,650 | A | 7/1985 | Wihl et al. |
| 4,762,396 | A | 8/1988 | Dumant et al. |
| 5,502,654 | A | 3/1996 | Sawahata |
| 5,655,110 | A | 8/1997 | Krivokapic et al. |
| 5,699,447 | A | 12/1997 | Alumot et al. |
| 5,723,233 | A | 3/1998 | Garza et al. |
| 5,825,647 | A | 10/1998 | Tsudaka |
| 5,879,844 | A | 3/1999 | Yamamoto et al. |
| 5,991,006 | A | 11/1999 | Tsudaka |
| 6,016,357 | A | 1/2000 | Neary et al. |
| 6,049,660 | A | 4/2000 | Ahn et al. |
| 6,077,310 | A | 6/2000 | Yamamoto et al. |
| 6,120,952 | A | 9/2000 | Pierrat et al. |
| 6,128,067 | A | 10/2000 | Hashimoto |
| 6,187,483 | B1 | 2/2001 | Capodieci et al. |
| 6,243,855 | B1 | 6/2001 | Kobayashi et al. |
| 6,249,904 | B1 | 6/2001 | Cobb |
| 6,263,299 | B1 | 7/2001 | Aleshin et al. |
| 6,269,472 | B1 | 7/2001 | Garza et al. |
| 6,301,697 | B1 | 10/2001 | Cobb |
| 6,317,859 | B1 | 11/2001 | Papadopoulou |
| 6,370,679 | B1 | 4/2002 | Chang et al. |

(Continued)

FOREIGN PATENT DOCUMENTS

JP         09319067 A    12/1997

(Continued)

OTHER PUBLICATIONS

Cobb, N., and Y. Granik, "Model-Based OPC Using the MEEF Matrix," *Proceedings of SPIE, vol. 4889: 22nd Annual BACUS Symposium on Photomask Technology*, Monterey, Calif., Sep. 30-Oct. 4, 2002, p. 147.

(Continued)

*Primary Examiner*—Sun J Lin
(74) *Attorney, Agent, or Firm*—Christensen O'Connor Johnson Kindness PLLC

(57) ABSTRACT

A method of calculating process conditions for performing optical and process correction (OPC) or other resolution enhancement techniques on a layout design. Process conditions are estimated on a layout database on a substantially uniform grid. Contour curves are created from the estimated process conditions. The contour curves are then compared against the features in the layout to determine edge placement errors. From the edge placement errors, OPC or other corrections for the features can be made.

35 Claims, 7 Drawing Sheets

U.S. PATENT DOCUMENTS

| | | | |
|---|---|---|---|
| 6,425,117 | B1 | 7/2002 | Pasch et al. |
| 6,453,452 | B1 | 9/2002 | Chang et al. |
| 6,453,457 | B1 | 9/2002 | Pierrat et al. |
| 6,467,076 | B1 | 10/2002 | Cobb |
| 6,499,003 | B2 | 12/2002 | Jones et al. |
| 6,643,616 | B1 | 11/2003 | Granik et al. |
| 6,665,845 | B1 | 12/2003 | Aingaran et al. |
| 6,792,159 | B1 | 9/2004 | Aufrichtig et al. |
| 6,792,590 | B1 | 9/2004 | Pierrat et al. |
| 2002/0199157 | A1 | 12/2002 | Cobb |
| 2003/0170551 | A1 | 9/2003 | Futatsuya |
| 2004/0005089 | A1 | 1/2004 | Robles et al. |
| 2004/0088149 | A1 | 5/2004 | Cobb |

FOREIGN PATENT DOCUMENTS

| | | |
|---|---|---|
| WO | WO 01/65315 A2 | 9/2001 |

OTHER PUBLICATIONS

Cobb, N., and A. Zakhor, "Experimental Results on Optical Proximity Correction With Variable Threshold Resist Model," *Proceedings of SPIE, vol. 3051: Symposium on Optical Microlithography X*, Santa Clara, Calif., Mar. 10-14, 1997, pp. 458-468.

Cobb, N., and A. Zakhor, "Fast, Low-Complexity Mask Design," *Proceedings of SPIE, vol. 2440: Symposium on Optical/Laser Microlithography VIII*, Santa Clara, Calif., Feb. 22-24, 1995, pp. 313-327.

Cobb, N., and A. Zakhor, "Fast Sparse Aerial Image Calculation for OPC," *Proceedings of SPIE, vol. 2621: 15th Annual BACUS Symposium on Photomask Technology and Management*, Santa Clara, Calif., Sep. 20-22, 1995, pp. 534-545.

Cobb, N., and A. Zakhor, "Large Area Phase-Shift Mask Design," *Proceedings of SPIE, vol. 2197: Symposium on Optical/Laser Microlithography VII*, San Jose, Calif., Mar. 2-4, 1994, pp. 348-360.

Cobb., N., et al., "Mathematical and CAD Framework for Proximity Correction," *Proceedings of SPIE, vol. 2726: Symposium on Optical Microlithography IX*, Santa Clara, Calif., Mar. 13-15, 1996, pp. 208-222.

Cobb, N., and Y. Granik, "Using OPC to Optimize for Image Slope and Improve Process Window," (Nov. 20, 2002), *Proceedings of SPIE, vol. 5130: Photomask Japan*, Japan, Apr. 16-18, 2003, p. 42.

Granik, Y., "Generalized MEEF Theory," *Interface 2001*, Nov. 2001.

Granik, Y., and N. Cobb, "MEEF as a Matrix," *Proceedings of SPIE, vol. 4562: 21st Annual BACUS Symposium on Photomask Technology*, Monterey, Calif., Oct. 2-5, 2001, pp. 980-991.

Granik, Y., and N. Cobb, "Two-Dimensional G-MEEF Theory and Applications," *Proceedings of SPIE, vol. 4754: Symposium on Photomask and Next-Generation Lithography Mask Technology IX*, Yokohama, Japan, Apr. 23-25, 2002, pp. 146-155.

Maurer, W., et al., "Process Proximity Correction Using an Automated Software Tool," *Proceedings of SPIE, vol. 3334: Optical Microlithography XI*, Santa Clara, Calif., Feb. 22-27, 1998, pp. 245-253.

Maurer, W., et al., "Evaluation of a Fast and Flexible OPC Package: OPTISSIMO," *Proceedings of SPIE, vol. 2884: 16th Annual Symposium on Photomask Technology and Management*, Redwood City, Calif., Sep. 18-20, 1996, pp. 412-418.

Ohnuma, H., et al., "Lithography Computer Aided Design Technology for Embedded Memory in Logic," *Japanese Journal of Applied Physics 37*(12B):6686-6688, Dec. 1998.

N. Cobb, "Flexible sparse and dense OPC algorithms," *Proceedings of SPIE, vol. 5853, Photomask and Next-Generation Lithography Mask Technology XII*, Bellingham, Washington, 2005, pp. 693-702.

Toh, K.K.H, and A.R. Neureuther, "Identifying and Monitoring Effects of Lens Aberrations in Projection Printing," Selected Papers on Resolution Enhancement Techniques in Lithography, SPIE Milestone Series 178:165-172, 2004; reprinted from Optical Microlithography V1, Proc. SPIE 772:202-209, Jan. 1987.

90nm sparse simulation

45nm sparse simulation

DENSE OPC

FIELD OF THE INVENTION

The present invention relates to photolithographic processing and, in particular, to optical and process correction.

BACKGROUND OF THE INVENTION

In conventional photolithographic processing, integrated circuits are created on a semiconductor wafer by exposing the wafer with a pattern of features printed on a mask or reticle. The pattern of features selectively exposes photosensitive chemicals on the wafer that is then further chemically and mechanically processed to build up layers of the integrated circuit.

As the features on a mask become smaller and smaller, optical distortions can occur whereby the exposure pattern on a wafer will not match the pattern of features on the mask. To correct this, numerous resolution enhancement techniques such as the addition of subresolution assist features, phase shift masks, and optical and process correction (OPC) may be employed to improve the image fidelity so that the pattern imaged on a wafer more faithfully matches the corresponding pattern of features on the mask.

In OPC, estimates are made where the edges of a mask feature will be printed on a wafer. The expected printing location is then compared with a desired location and an edge placement error (EPE) is determined. From the EPE, a determination is made if the corresponding position of an edge on the photolithographic mask should be moved in order to precompensate for the expected error on the wafer.

FIG. 1 illustrates a simplified target feature 10 of a layout design that will create a corresponding object on a semiconductor wafer. The feature 10 is typically defined as a polygon in standard layout database language such as GDS-II or OASIS™. In order to simulate how the feature will be created on a wafer, the feature 10 is analyzed by a computer program that divides the perimeter of the feature with a number of fragmentation endpoints 12. The fragmentation endpoints 12 define corresponding edge segments 14, 16, 18, etc., that represent a portion of the perimeter of the polygon that defines the feature 10. Simulation sites 20 are then defined for one or more of the edge segments. A simulation site 20 defines a number of points where image intensity values or other process parameters are calculated. From the calculated image intensities at a simulation site, an EPE for a corresponding edge segment is calculated. From the EPE, an OPC software tool determines whether one or more edge segments in the layout should be moved in order to improve the printing fidelity on the wafer. After moving one or more of the edge segments, the EPEs may be recalculated and other adjustments made in an iterative fashion. Once all EPEs are within an acceptable tolerance, the corrected pattern of features is printed on a photolithographic mask for use in creating corresponding integrated circuits.

FIG. 2A illustrates a more realistic example of a layout design pattern and corresponding pattern of simulation sites. A pattern of design features 30 are fragmented into edge segments and assigned corresponding simulation sites 32 at which process parameters for a corresponding edge segment are calculated. In the example shown in FIG. 2A, the space between individual simulation sites is relatively large with respect to the area occupied by the layout features. However, FIG. 2B illustrates the same layout of design features 40 shown in FIG. 2A except the features are half the size. If features 40 are exposed with the same wavelength of light as the features in FIG. 2A, the size of the simulation sites should remain generally the same. As can be seen, the pattern of simulation sites 42 requires that many simulations be performed in very nearly the same location in the layout. The simulations may overlap in some areas but be absent in other areas, thereby resulting in an inefficient and time consuming process of estimating how the features will print.

Given these problems, there is a method of simplifying the estimation of process conditions in order to calculate optical and process corrections or other resolution enhancements for small features.

SUMMARY OF THE INVENTION

To address the problems discussed above, the present invention is a method of calculating process conditions for use in performing OPC or other resolution enhancement techniques. Process conditions in a layout are estimated using a substantially uniform grid of sample points. From the simulations performed at each grid point, contour lines of a process parameter having constant values are calculated. From the contour lines, estimates of an edge placement error for edge segments of the layout design are computed and OPC corrections or other resolution enhancements may be made.

BRIEF DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein.

DETAILED DESCRIPTION OF THE PREFERRED EMBODIMENT

The present invention is a technique for calculating process conditions in order to perform optical and process correction (OPC) or other resolution enhancement techniques on a target layout design of features to be created on a semiconductor wafer.

Figure 1:
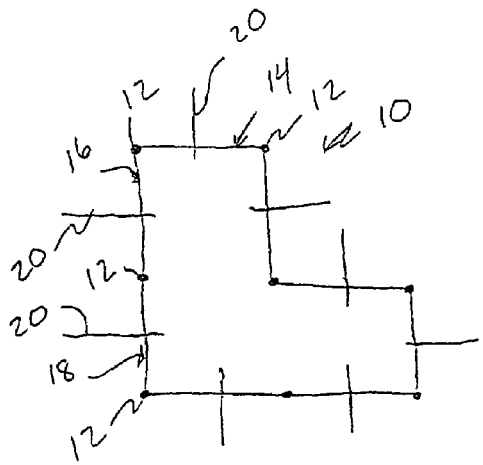
FIG. 1 is a simplified illustration of a conventional technique for calculating process conditions in the area of an edge segment.
Figure 2A:
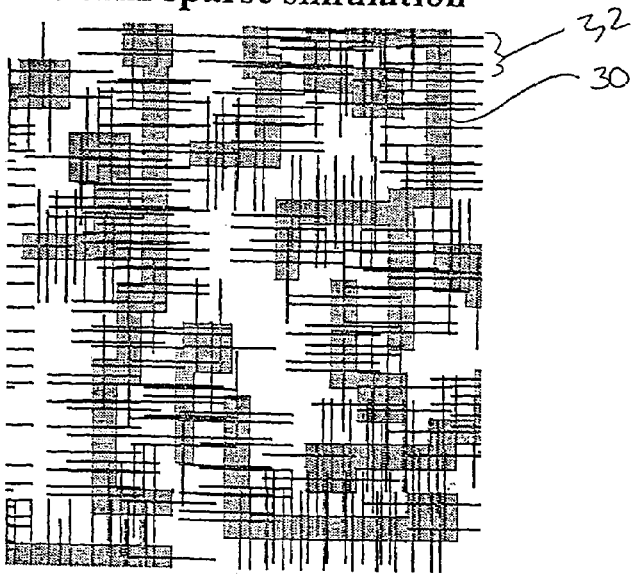
FIG. 2A illustrates a conventional method of calculating process conditions in a 90 nanometer layout.
Figure 2B:
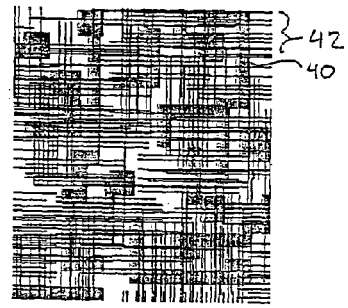
FIG. 2B illustrates the difficulties incurred when the simulation techniques shown in FIG. 2A are applied to a 45 nanometer layout.
Figure 3A:
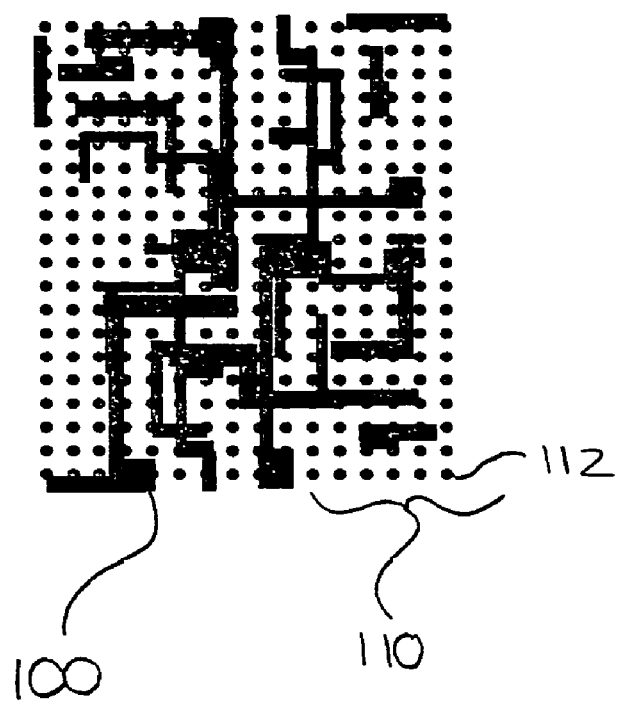
FIG. 3A illustrates a technique for calculating process conditions in accordance with one embodiment of the present invention.

As shown in FIG. 3A, a target layout design includes a number of features 100 that correspond to circuit elements to be created on a semiconductor wafer. In one embodiment, each feature 100 is defined as a polygon in a standard layout database language such as GDS-II or OASIS™. In order to improve the fidelity by which the pattern of features 100 can be created on a semiconductor wafer, simulations of one or more process conditions are performed on a grid 110 of sample points 112. The grid 110 may be uniform across the entire layout. Alternatively, the grid may have sample points 112 at a wider pitch in areas of the circuit contain fewer features or features that are not critical to circuit operation. Alternatively, those features that are in dense arrangements or are critical to the operation of the circuit that can be simulated at sample points with a decreased pitch. The pitch of the sample points 112 in the grid 110 may be determined by the user or selected by a rule or model in accordance with the photolithographic operating parameters, including illumination wavelength, $\lambda$, source pattern, numerical aperture, NA, etc. In one embodiment, the sample points 112 have a pitch selected such that sampling of the process conditions is a function of the Nyquist frequency for the photolithographic processing system. For example, sampling can occur at 1×, 2×, 3×, 4×, ½×, ⅓×, ¼× of the Nyquist frequency.

Figure 3B:
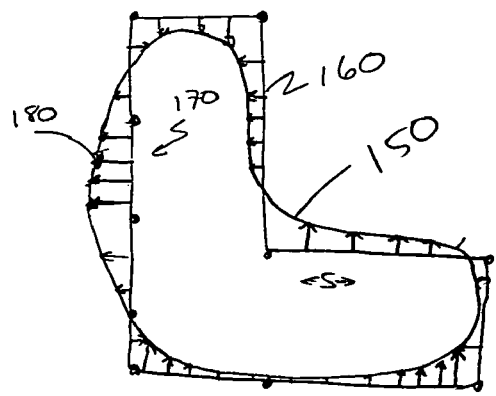
FIG. 3B illustrates how edge placement errors for edge segments are determined in accordance with an embodiment of the present invention.

From the results obtained at each of the simulation sample points 112, contour curves are computed that define boundaries of regions having substantially the same process parameter value. In one embodiment, the contour curves are computed from the simulation results obtained at each of the sample points and stored as a polygon in the layout database. The contour curve may be computed by interpolating the results obtained at the grid sample points or using other mathematical techniques. Such contours can also be generated, for example, using a "constant threshold" applied to an aerial image. A contour curve defines a number of points in the layout having the same computed image intensity. However, contour curves could be created for other computed process conditions such as contrast, image intensity slope, etc., or using non-constant models, such as the variable-threshold resist (VTR) model. An example of a contour curve 150 is shown in FIG. 3B. The position of the contour curve 150 is compared to the desired position of a feature 160 to be created on the wafer at one or more points on an edge segment. From the comparison, an estimate of the EPEs for edge segments of the feature are determined, and corresponding OPC corrections or other resolution enhancements can be made.

Figure 3C:
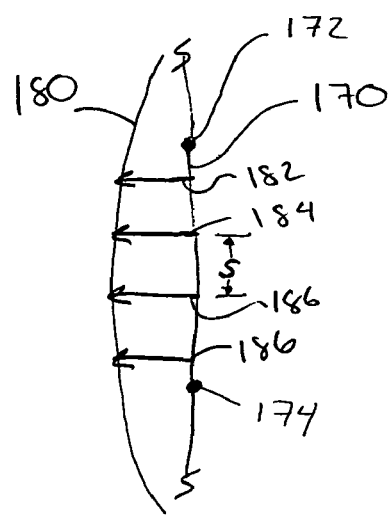
FIG. 3C illustrates further detail of how an edge placement error for an edge segment is calculated in accordance with an embodiment of the present invention.

FIG. 3C illustrates further detail of a feature having an edge segment 170 and a nearby contour curve 180. In the embodiment shown, the edge segment 170, defined by fragmentation endpoints 172 and 174, and the contour curve 180 are compared by calculating the distance between the edge segment 170 and the contour curve 180. Distance measurements are made at points 182, 184, 186, and 188. Each measurement represents the EPE for that portion of an edge segment. The number of points at which the distance between the edge segment 170 and the contour curve 180 may be fixed or variable. In addition, the spacing, S, between the measurement points 182-188 may be selected by the user or determined by a rule or model in accordance with process conditions such as illumination wavelength $\lambda$, numerical aperture, NA, etc.

It is generally preferable that the sampling distance, S, be a function of the Nyquist frequency of the photolithographic processing system. For example, the layout may be sampled at twice the Nyquist frequency. However, other multiples such as 2×, 3×, 4×, ½×, ⅓×, ¼×, etc., may be used. Other sampling spacings can also be used, depending on the conditions and the features being imaged, and need not be constant throughout the layout. In dense areas, dense samplings can be used. For sparse regions, sparse spacings can be used. The sampling spacing can be selected due to local density, image properties such as intensity, slope, contrast, etc., tag identifiers for the features, or other properties known to those skilled in the art.

From the measurements made at points 182-186, a "pseudo EPE" or combined EPE for the edge segment 170 is calculated. The pseudo EPE may be the average of the individual EPEs calculated for the edge segment. Alternatively, the pseudo EPE can be defined as the maximum EPE calculated, the minimum EPE calculated, the median of the EPEs calculated, or another function defined by a user, rule, or model. Once the pseudo EPE for the edge segment 170 is calculated, correction for the edge segment 170 may be calculated in a manner used in conventional OPC processing or other resolution enhancement technique may be applied for the edge segment.

Figure 4:
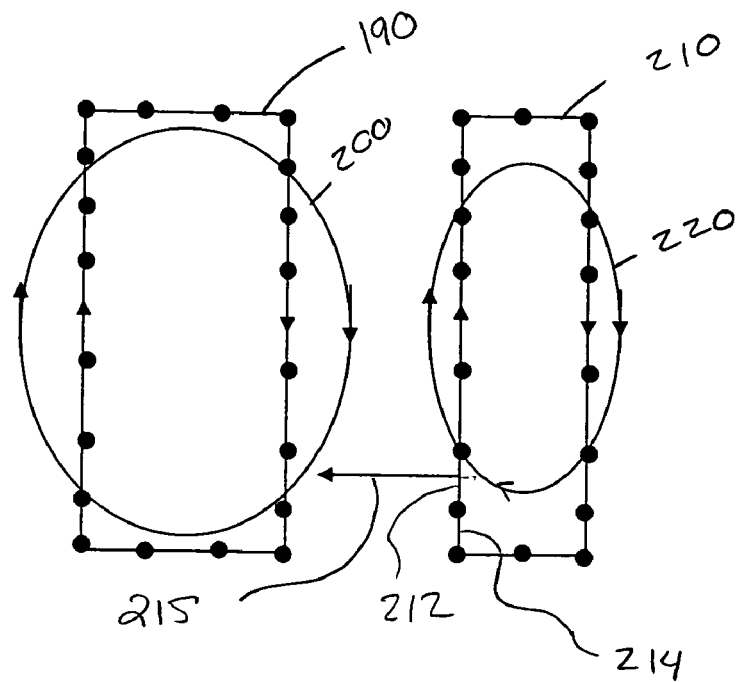
FIG. 4 illustrates one technique for computing the distance between an edge segment and a contour curve in accordance with another aspect of the present invention.

In some instances, computing the distance between an edge fragment and a corresponding contour curve may be unclear. FIG. 4 illustrates a layout including a pair of features 190 and 210. A contour curve 200 is positioned generally over the feature 190, and a contour curve 220 is positioned generally over the feature 210. Feature 210 includes an edge segment 212 from which it is desired to measure the distance between the edge segment and its corresponding contour curve. If a measurement is made extending in the leftward direction as shown, the measurement will be made to the contour curve 200 instead of the contour curve 220. Therefore, steps should be taken to ensure that measurements to the wrong contour curve are not made.

In one embodiment of the invention, all polygons and contour curves in the layout are defined to have a certain direction. In one embodiment of the invention, all polygons and contours are defined to have a clockwise direction. That is, each feature or contour curve is defined as a series of vertices in the layout database. Therefore, the vertices that define the feature or contour curve are stored in an order that traces out the perimeter of the feature or contour curve in a clockwise direction.

If an edge segment is inside a contour curve, a line drawn outwardly from the edge segment will cross a contour curve that is oriented in the same direction as the edge segment in question. In the example shown in FIG. 4, a line 215 extending outwardly from the edge segment 212 crosses the contour curve 200 that is defined to extend in the opposite direction to the direction of edge segment 212. Therefore, it can be assumed that the contour curve 200 is the incorrect contour curve for determining an EPE of the edge segment 212. Conversely, if a line is drawn from the edge segment 212 in the inward direction, it will cross contour curve 220 at a point that is defined to be in the same direction as edge segment 212. Therefore, this point is deemed to be the correct contour curve to measure the EPE of the edge segment 212. Feature 210 also includes an edge segment 214 that is not aligned with any part of the contour curve associated with the feature 210. That is, measurements made in the inward direction from edge segment 214 do not encounter a contour curve 220. In one embodiment of the present invention, if no contour curve is encountered within a predefined maximum distance from an edge segment, a maximum EPE is assigned for the edge segment.

Figure 5:
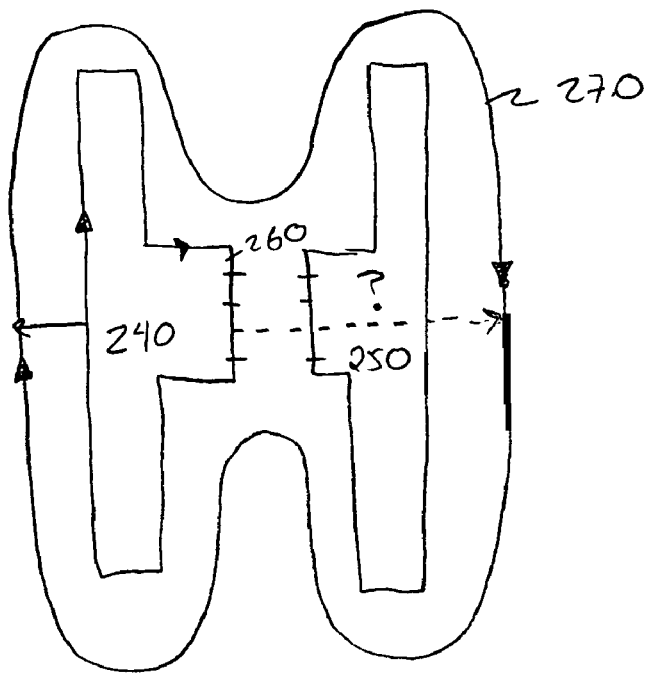
FIG. 5 illustrates a technique for avoiding errors when calculating an edge placement error in accordance with another embodiment of the present invention.

FIG. 5 illustrates a pair of features 240, 250. A contour curve 270 is defined around the pair of features 240 and 250. Feature 240 includes an edge segment 260 from which the distance to the contour curve is to be determined. In the example shown, an outwardly extending measurement from edge segment 260 passes through an edge segment of feature 250 before crossing a portion of the contour curve 270. Although edge segment 260 and the crossing point on contour curve 270 are defined in the same direction, the fact that the measurement passes through the edge segments of the intervening feature 250 indicate that the measurement to contour curve 270 is in error. Therefore, a rule such as applying a maximum EPE or no EPE for the edge segment 260 can be utilized.

Figure 6:
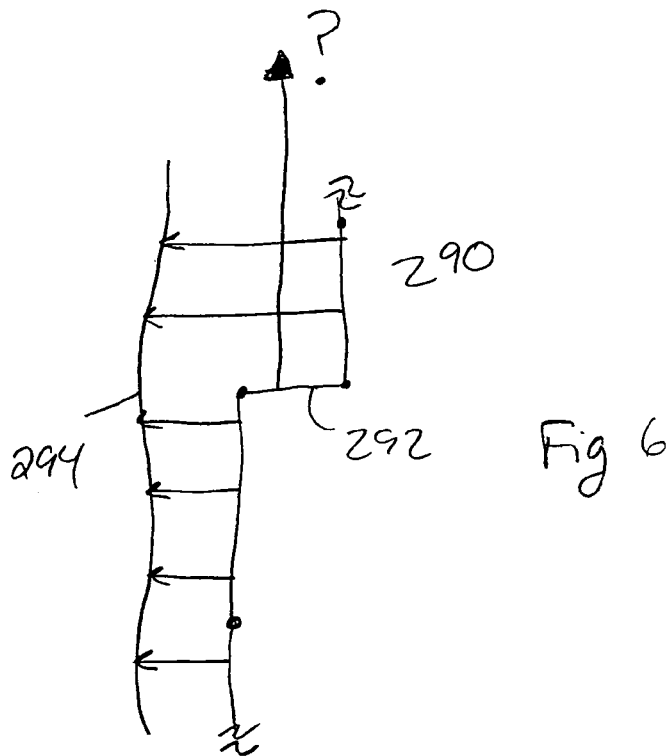
FIG. 6 illustrates another technique for avoiding errors in computing edge placement errors in accordance with an embodiment of the present invention.

In some layout configurations, measuring the distance between an edge segment and a contour curve can yield erroneous results. FIG. 6 illustrates a portion of a feature 290, including an edge segment 292 and a contour curve 294. As can be seen, the edge segment 292 is oriented in a direction that is generally perpendicular to a direction of the contour curve 294. If a measurement is made in the inward or outward direction with respect to the edge segment 292, the measurement will be made in a direction generally parallel to contour curve 294 and an overly large pseudo-EPE may be computed. In one embodiment of the invention, one or more rules may be defined whereby edge segments that are perpendicular to a nearby contour curve can be eliminated from consideration. In alternative embodiments of the invention, other metrics can be used to identify edge segments such as edge segment 292 where errors may occur. For example, in one embodiment of the invention, the angle between orientation of the edge segment in question and a line tangent to the contour curve is determined. If the angle approaches 90° or some other predefined value, then measurement at that location may be omitted.

Figure 7:
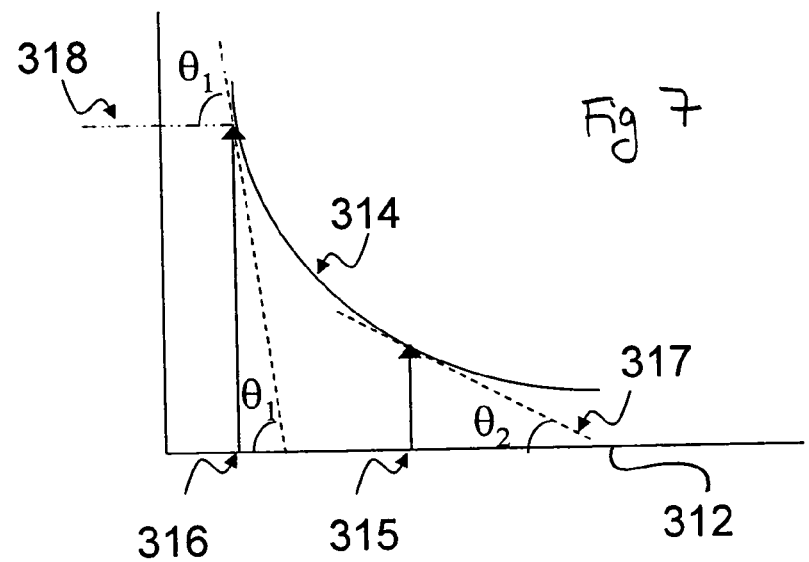
FIG. 7 illustrates yet another technique for avoiding errors in computing edge placement errors in accordance with another embodiment of the present invention.

FIG. 7 illustrates a portion of a feature 300 including an edge segment 312 and a contour curve 314. Measurements between the edge segment 312 and the constant contour curve 314 are made at a number of points on the edge segment, such as at points 315 and 316. At a point 315, the angle between a line 317 tangential to the contour curve 314 and a line parallel to the edge segment 312 is relatively small, and pseudo-EPEs can be reasonably computed. At a point 316, the angle between a line tangential to the constant contour curve 314 and a line parallel to the edge segment 312 approaches 90°. In this case, a reasonable pseudo-EPE is very difficult to interpret. Therefore, in one embodiment of the invention, no measurement is made between the edge segment and the contour curve when such angles approach 90°.

Figure 8:
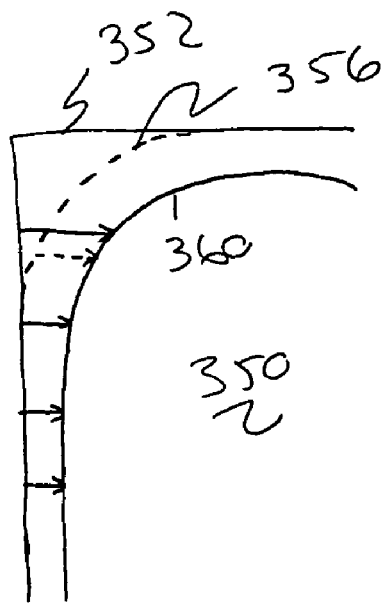
FIG. 8 illustrates a technique for changing a target layout prior to calculating edge placement errors in accordance with an embodiment of the present invention.

In some embodiments of the invention, definitions of features from which measurements are made to the contour curves can be varied in accordance with achievable photolithographic results. FIG. 8 illustrates a portion of a feature 350 having a corner region 352. Because it is virtually impossible to create a perfect corner in a small feature with a photolithographic process, any measurements made between the corner and a contour curve 360 will indicate a large pseudo-EPE that is difficult to correct. Therefore, a corner region 352 can be redefined by, for example, rounding the corner region into a new, more achievable corner region 356 and making the measurements between the newly defined corner region 356 and the contour curve 360. The redefining of a feature may be user defined, defined by a rule, defined using predetermined tags, or may be defined by a model-based simulation in accordance with the feature layout and process parameters to be used.

Figure 9:
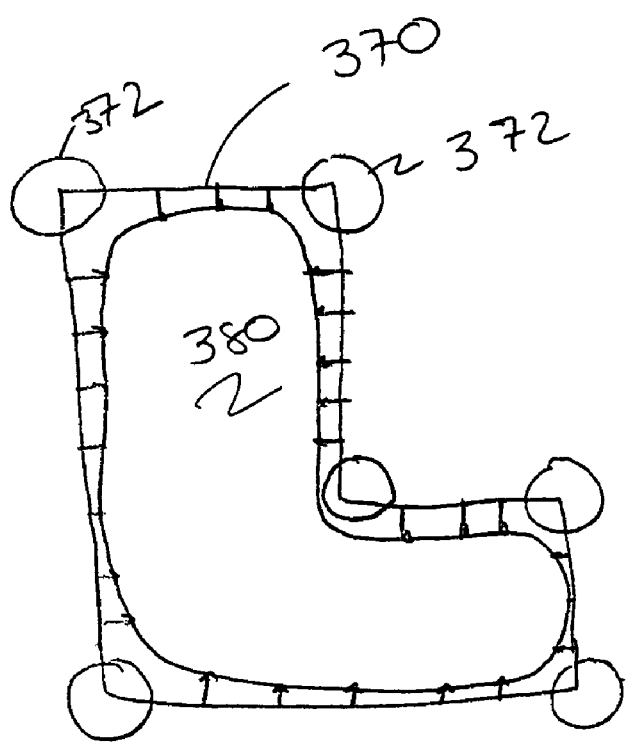
FIG. 9 illustrates a technique for restricting the calculation of edge placement errors in accordance with an embodiment of the present invention.

FIG. 9 illustrates another technique for avoiding errors in calculating pseudo-EPE. In the example shown, a feature 370 includes a number of corner regions 372. To avoid producing erroneous measurements in the corner regions 372, segments in those regions may be identified and tagged such that no measurement to the contour curve occurs in the area of a concave or convex corner region. In another embodiment, other "difficult" areas can be identified and no measurements between the feature and the corresponding contour curve can be made in that region.

Figure 10:
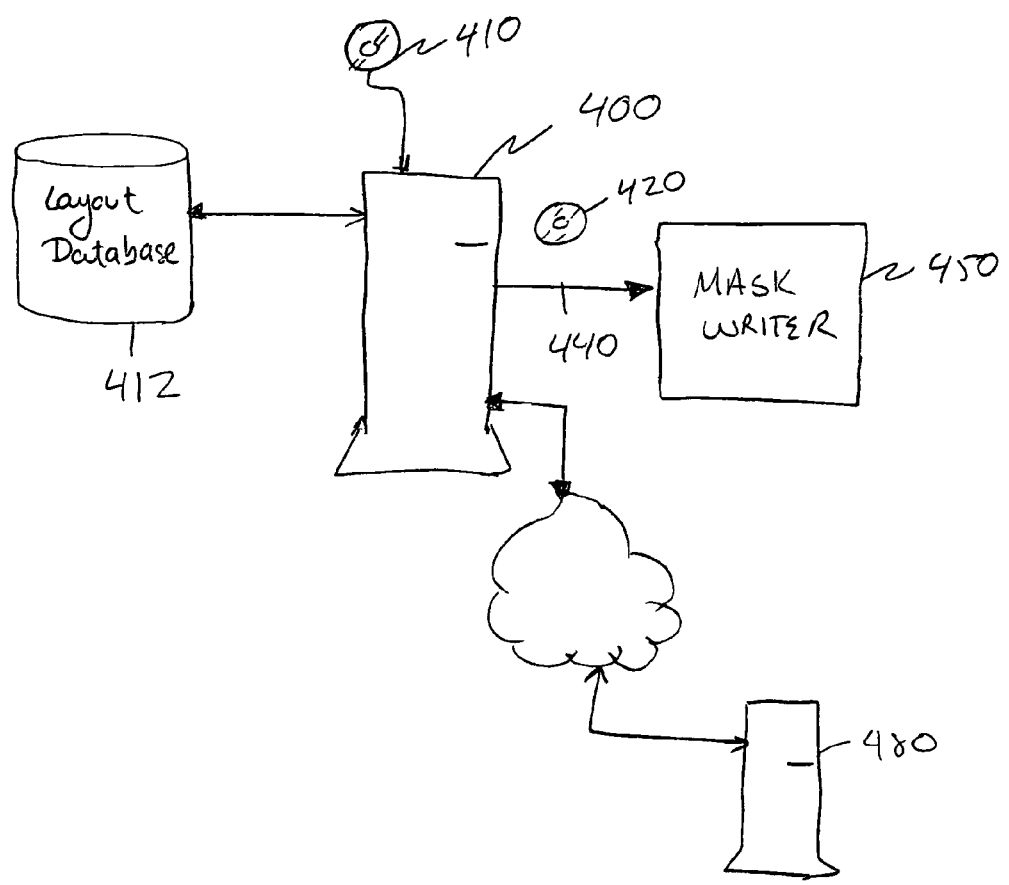
FIG. 10 illustrates a representative computer system that implements the present invention.
Figure 1:
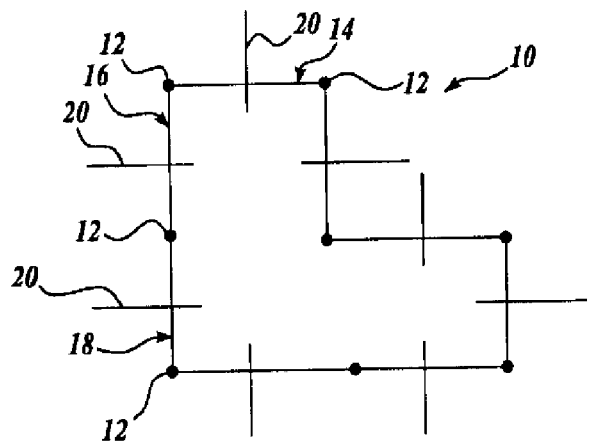
Figure 2A:
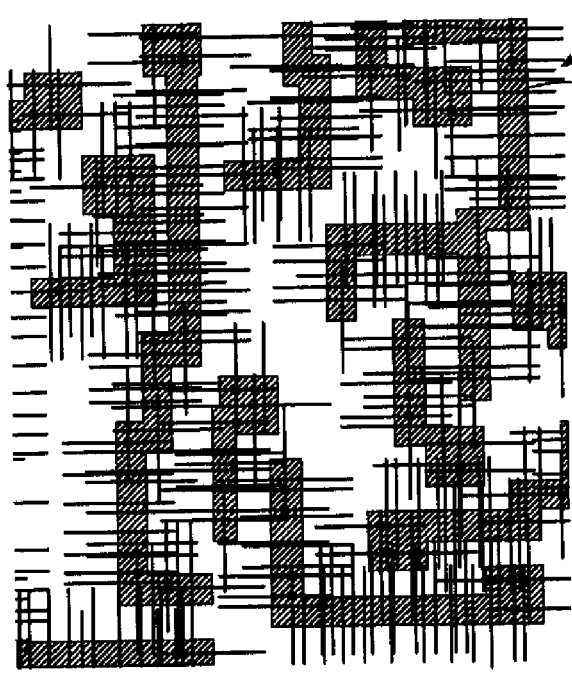
Figure 2B:
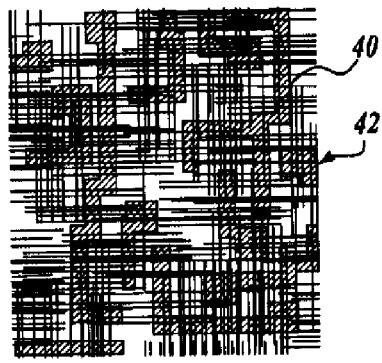
Figure 4:
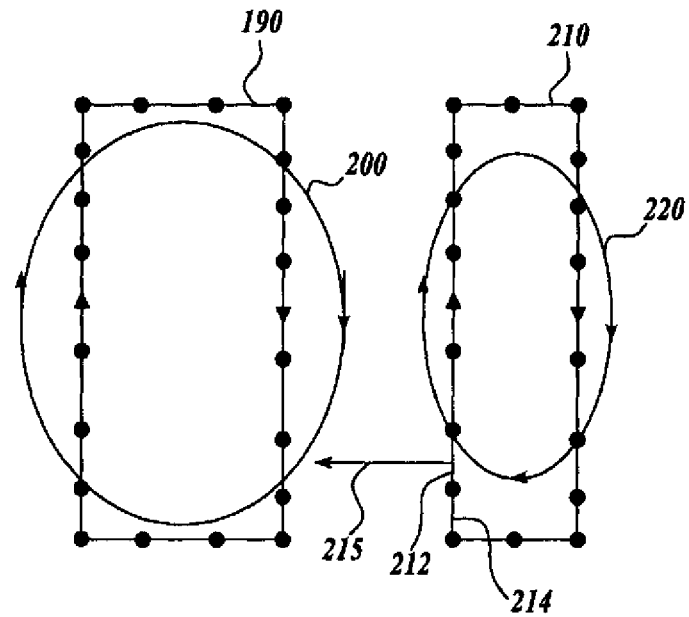
Figure 5:
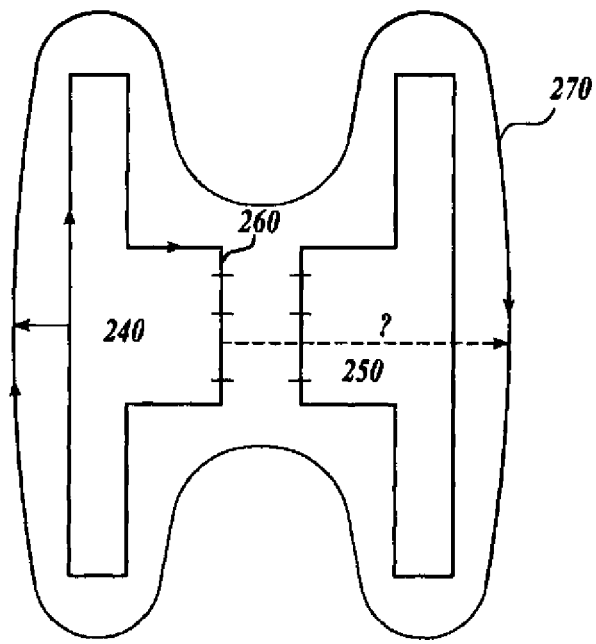
Figure 6:
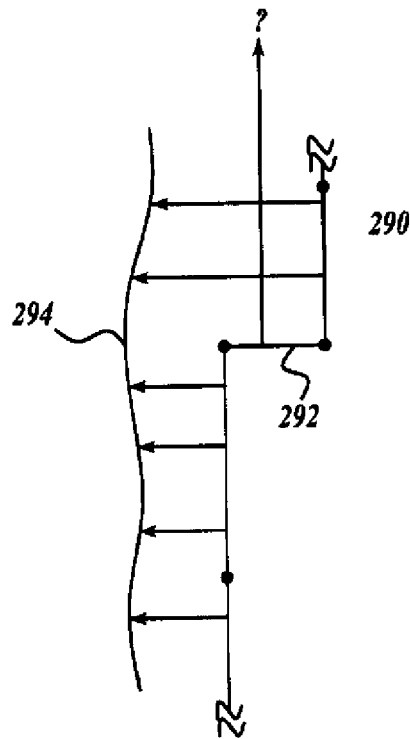
Figure 7:
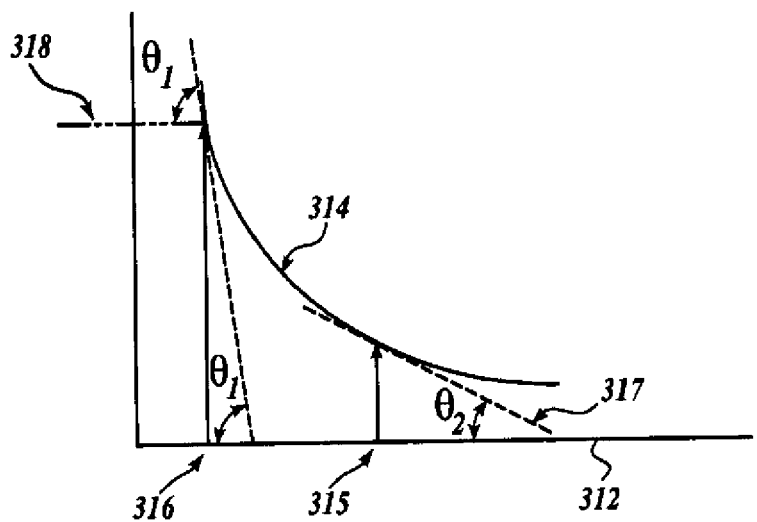
Figure 8:
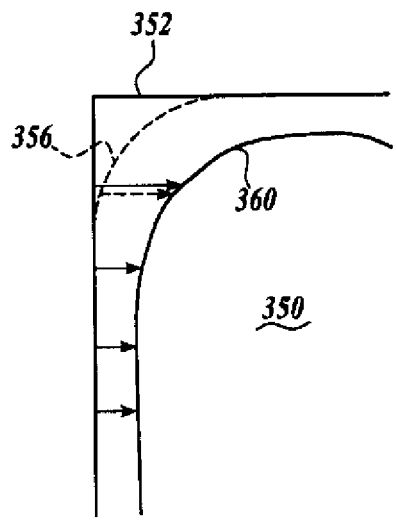
Figure 9:
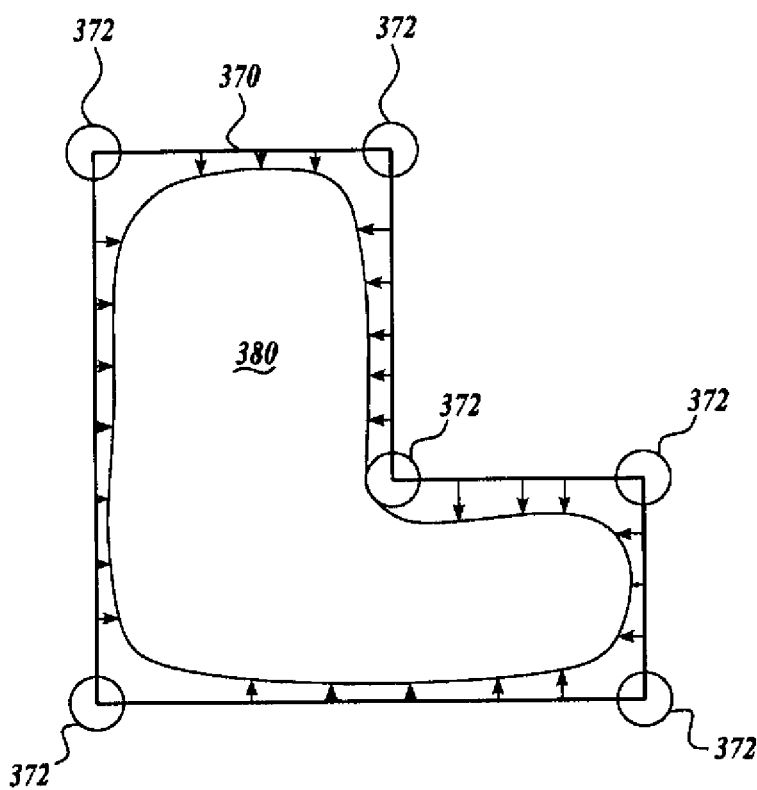
Figure 10:
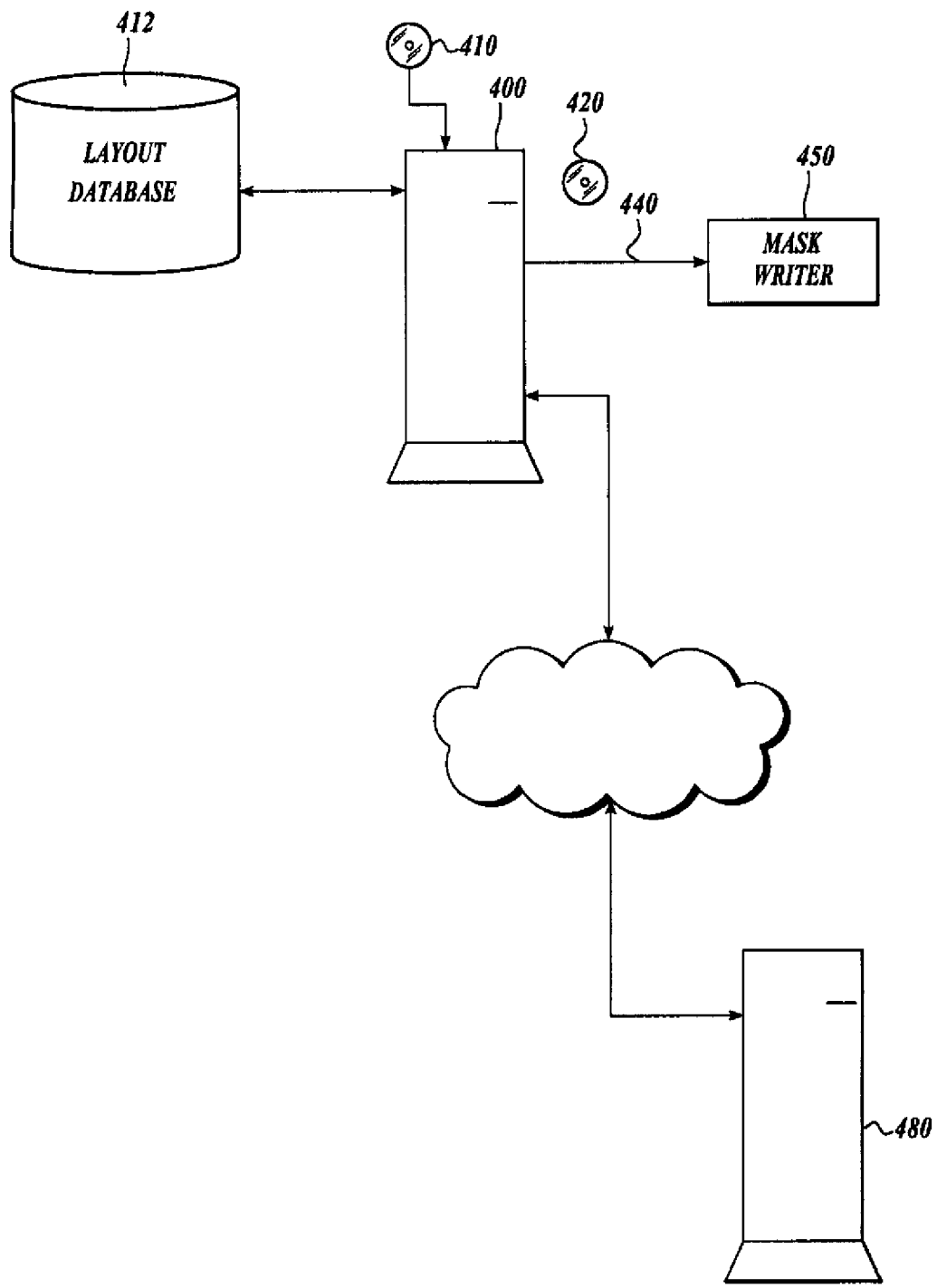

FIG. 10 illustrates one embodiment of a computer system useful for carrying out the present invention. A computer 400 receives a set of executable instructions on a computer-readable media 410 or via a wired or wireless communication link. The executable instructions cause the computer system 400 to access a layout database 412 to retrieve a target layout. The target layout is analyzed by the computer system 400 in order to compute a series of OPC corrections or other resolution enhancements as described above. The corrected layout is then transmitted either on a computer-readable media 420 or via a wired or wireless communication link 440 to a mask writing tool 450 that produces a number of photolithographic masks for use in creating the integrated circuits on a semiconductor wafer. Alternatively, the computer system 400 may transmit all or a portion of the target layout to one or more remotely located computers 480 that may be inside or outside the United States. The remotely located computers 480 can operate to produce corrected mask layout data or portions thereof for return either to the computer system 400 or directly to a mask writing tool 450. The computer system 400 may be a stand-alone single or multi-processor device or may be a networked computer system. In one embodiment, the computer system 400 or remotely located computers 480 may be provided with a hardware acceleration board including circuitry that is specially designed to accelerate the computation of images and/or resolution enhancement corrections.

While the preferred embodiment of the invention has been illustrated and described, it will be appreciated that various changes can be made therein without departing from the scope of the invention. For example, although the described embodiments of the invention are used to produce corrected layout data for integrated circuits, the present invention is applicable to any device to be created by a photolithographic process. Examples of such devices include, but are not limited to, micro-electro-mechanical systems (MEMS), photonic crystals, integrated optical devices, heads for magnetic storage, etc. Therefore, it is intended that the scope of the invention be determined from the following claims and equivalents thereof.

The embodiments of the invention in which an exclusive property or privilege is claimed are defined as follows:

1. A method of correcting printing distortions in features to be created via a photolithographic process, comprising:

receiving a pattern of features corresponding to an area of a layout design;

fragmenting one or more of the features into a number of edge segments;

estimating a process condition at a substantially uniform pattern of sampling points extending over the area of the layout design;

computing contour curves of points having substantially the same process condition from the estimated process condition determined at the sampling points in the substantially uniform pattern;

comparing the contour curves to the features; and using a comparison of the contour curves and the features to correct the features for photolithographic printing distortions.

2. The method of claim 1, wherein the process condition is the image intensity.

3. The method of claim 1, wherein the process condition is the image contrast.

4. The method of claim 1, wherein the process condition is the image slope.

5. The method of claim 1, wherein the contour curves and the features are compared by determining a distance between an edge segment of a feature and a contour curve.

6. The method of claim 5, wherein distances are measured at a plurality of points between the edge segment and the contour curve.

7. The method of claim 5, further comprising:
redefining areas of a feature to be practical to manufacture and comparing a contour curve and the redefined areas to correct the feature for photolithographic printing distortions.

8. The method of claim 6, further comprising:
determining an edge placement error for the edge segment from the plurality of distance measurements determined.

9. The method of claim 8, further comprising determining an edge placement error from a maximum distance of the plurality of distances determined.

10. The method of claim 8, further comprising determining an edge placement error from a minimum distance of the plurality of distances determined.

11. The method of claim 8, further comprising determining an edge placement error from a function of the plurality of distances determined.

12. The method of claim 11, wherein the function is an average.

13. The method of claim 11, wherein the function is a mean of the plurality of distances.

14. The method of claim 1 further comprising:
increasing a density of sampling points in the substantially uniform pattern in areas of the layout design that are dense.

15. The method of claim 1 further comprising:
increasing a density of sampling points in the substantially uniform pattern in areas that are critical to operating a circuit created with the layout design.

16. The method of claim 1, wherein the substantially uniform pattern of sampling points has a spacing that is a function of a Nyquist frequency of the photolithographic process.

17. The method of claim 1, wherein distances between the contour curve and an edge segment are determined at a number of locations on the edge segment having a spacing corresponding to a Nyquist frequency of the photolithographic process.

18. The method of claim 1, further comprising:
determining one or more areas in a feature where the feature and a contour curve are not compared.

19. The method of claim 18, wherein the areas in the feature that are not compared with the contour curve are determined by:
determining an angle between a line tangential to the contour curve and the direction of an edge segment on a feature, and not comparing the contour curve and the edge segment on the feature if the angle is greater than a maximum angle.

20. A computer-readable medium containing a sequence of instructions that when executed by a computer cause the computer to perform a method correcting printing distortions in features to be created via a photolithographic process, by:

receiving a pattern of features corresponding to an area of a layout design;

fragmenting one or more of the features into a number of edge segments;

estimating a process condition at a substantially uniform pattern of sampling points extending over the area of the layout design;

computing contour curves of points having substantially the same process condition from the estimated process condition determined at the sampling points of the substantially uniform pattern;

comparing the contour curves to the features; and using a comparison of the contour curves and the features to correct the features for photolithographic printing distortions.

21. A method of correcting printing distortions in features to be created via a photolithographic process, comprising:

receiving a pattern of features corresponding to an area of a layout design;

transmitting the pattern of features to a remotely located computer that performs the acts of:
fragmenting one or more of the features into a number of edge segments;

estimating a process condition at a substantially uniform pattern of sampling points extending over the area of the layout design;

computing contour curves of points having substantially the same process condition from the estimated process condition determined at the sampling points in the substantially uniform pattern;

comparing the contour curves to the features; and using a comparison of the contour curves and the features to correct the features for photolithographic printing distortions.

22. A method of correcting printing distortions in features to be created via a photolithographic process, comprising:

receiving a pattern of features corresponding to an area of a layout design;

fragmenting one or more of the features into a number of edge segments;

estimating a process condition at a substantially uniform pattern of sampling points in at least a portion of the area of the layout design, wherein the pattern of the sampling points have a spacing that is a function of a Nyquist frequency of the photolithographic process;

computing contour curves of points having substantially the same process condition from the estimated process condition determined at the sampling points in the substantially uniform pattern;

comparing the contour curves to the features; and using a comparison of the contour curves and the features to correct the features for photolithographic printing distortions.

23. A computer storage media including a sequence of instructions that are executable by a computer to perform the method of claim 22.

24. A method of correcting printing distortions in features to be created via a photolithographic process, comprising:

receiving a pattern of features corresponding to an area of a layout design;

fragmenting one or more of the features into a number of edge segments;

estimating a process condition at a substantially uniform pattern of sampling points in at least a portion of the area of the layout design;

computing contour curves of points having substantially the same process condition from the estimated process condition determined at the sampling points in the substantially uniform pattern;

comparing the contour curves to the edge segments by determining a distance between the contour curve and an edge segment at a number of locations on the edge segment, wherein the locations on the edge segments have a spacing corresponding to a Nyquist frequency of the photolithographic process; and using a comparison of the contour curves and the features to correct the features for photolithographic printing distortions.

25. A computer storage media including a sequence of program instructions that are executable by a computer to perform a method of correcting printing distortions in features to be created via a photolithographic process, by:

receiving a pattern of features corresponding to an area of a layout design;

fragmenting one or more of the features into a number of edge segments;

estimating a process condition at a substantially uniform pattern of sampling points in at least a portion of the area of the layout design;

computing contour curves of points having substantially the same process condition from the estimated process condition determined at the sampling points in the substantially uniform pattern;

comparing the contour curves to the edge segments by determining a distance between the contour curve and an edge segment at a number of locations on the edge segment, wherein the locations on the edge segments have a spacing corresponding to a Nyquist frequency of the photolithographic process; and using a comparison of the contour curves and the features to correct the features for photolithographic printing distortions.

26. A method of correcting printing distortions in features to be created via a photolithographic process, comprising:

receiving a pattern of features corresponding to an area of a layout design;

fragmenting one or more of the features into a number of edge segments;

estimating a process condition at a substantially uniform pattern of sampling points in at least a portion of the area of the layout design;

computing contour curves of points having substantially the same process condition from the estimated process condition determined at the sampling points in the substantially uniform pattern;

comparing the contour curves to some of the edge segments of the features and determining one or more edge segments of a feature and a contour curve that are not compared by:

determining an angle between a line tangential to the contour curve and the direction of an edge segment on a feature; and not comparing the contour curve and the edge segment on the feature if the angle is greater than a maximum angle; and using a comparison of the contour curves and the features to correct the features for photolithographic printing distortions.

27. A computer readable storage media including a sequence of program instructions that are executable by a computer to perform a method of correcting printing distortions in features to be created via a photolithographic process, by:

receiving a pattern of features corresponding to an area of a layout design;

fragmenting one or more of the features into a number of edge segments;

estimating a process condition at a substantially uniform pattern of sampling points in at least a portion of the area of the layout design;

computing contour curves of points having substantially the same process condition from the estimated process condition determined at the sampling points in the substantially uniform pattern;

comparing the contour curves to some of the edge segments of the features and determining one or more edge segments of a feature and a contour curve that are not compared by:

determining an angle between a line tangential to the contour curve and the direction of an edge segment on a feature; and not comparing the contour curve and the edge segment on the feature if the angle is greater than a maximum angle; and using a comparison of the contour curves and the features to correct the features for photolithographic printing distortions.

28. A method of correcting printing distortions in features to be created via a photolithographic process, comprising:

receiving a pattern of features corresponding to an area of a layout design;

redefining areas of one or more features to be practical to manufacture;

fragmenting one or more of the features into a number of edge segments;

estimating a process condition at a substantially uniform pattern of sampling points in at least a portion of the area of the layout design;

computing contour curves of points having substantially the same process condition from the estimated process condition determined at the sampling points in the substantially uniform pattern, wherein the contour curves and the features are compared by determining a distance between an edge segment of a feature and a contour curve;

comparing the contour curves and the redefined areas of the one or more features; and using a comparison of the contour curves and the redefined areas of the one or more features to correct for photolithographic printing distortions.

29. A computer storage media including a sequence of instructions that are executable by a computer to perform a method of correcting printing distortions in features to be created via a photolithographic process, by:

receiving a pattern of features corresponding to an area of a layout design;

redefining areas of one or more features to be practical to manufacture;

fragmenting one or more of the features into a number of edge segments;

estimating a process condition at a substantially uniform pattern of sampling points in at least a portion of the area of the layout design;

computing contour curves of points having substantially the same process condition from the estimated process condition determined at the sampling points in the substantially uniform pattern, wherein the contour curves and the features are compared by determining a distance between an edge segment of a feature and a contour curve;

comparing the contour curves and the redefined areas of the one or more features; and using a comparison of the contour curves and the redefined areas of the one or more features to correct for photolithographic printing distortions.

30. A method of correcting printing distortions in features to be created via a photolithographic process, comprising:

fragmenting one or more of the features of a layout design into a number of edge segments;

estimating one or more process conditions at a substantially uniform pattern of sampling points that extends over an area of the layout design, wherein the substantially uniform pattern of sampling points has a spacing that is a function of a Nyquist frequency of the photolithographic process;

computing contour curves of points having substantially the same process condition from the one or more estimated process conditions determined at the sampling points in the substantially uniform pattern;

determining a distance between the contour curves and an edge segment of a feature as an estimate of the edge segments edge placement error (EPE); and using the estimated EPE of the edge segment with a resolution enhancement technique to correct for photolithographic printing distortions.

31. The method of claim 30, wherein the edge segments and contour curves are defined to have a direction; and wherein the distance between a contour curve and an edge segment is determined by:

extending one or more lines from the edge segment until the one or more lines cross a contour curve and using a length of the one or more lines as the distance between the edge segment and the contour curve if the edge segment and the contour curve have the same direction.

32. The method of claim 30, wherein the one or more lines comprise two or more lines that are spaced by a sampling distance that is a function of a Nyquist frequency of the photolithographic process.

33. The method of claim 31, wherein the EPE of a edge segment is determined by averaging a length of the two or more lines extending from the edge segment to the contour line.

34. The method of claim 31, wherein the EPE of a edge segment is determined by selecting a largest length of the two or more lines extending from the edge segment to the contour line.

35. A computer storage media having a sequence of instructions stored thereon that are executable by a computer to perform any of method claims 30-34.

* * * * *

UNITED STATES PATENT AND TRADEMARK OFFICE
CERTIFICATE OF CORRECTION

PATENT NO. : 7,434,199 B2
APPLICATION NO. : 11/236208
DATED : October 7, 2008
INVENTOR(S) : N. B. Cobb et al.

It is certified that error appears in the above-identified patent and that said Letters Patent is hereby corrected as shown below:

Delete Title Page containing an illustrative figure, and substitute the attached Title Page Delete Drawing Sheets 1-6, and replace with attached Drawing Sheets

| COLUMN | LINE | ERROR |
|---|---|---|
| (56) Pg. 2, col. 2 | Refs. Cited (Other Publs., Item 2) | after "*Photomask Japan,*" insert --Yokohama,-- |
| 7 (Claim 14, | 43 line 1) | after "claim 1" insert --,-- |
| 7 (Claim 15, | 47 line 1) | after "claim 1" insert --,-- |
| 7 (Claim 19, | 67 line 6) | "feature," should read --feature;-- |
| 12 (Claim 30, | 3 line 17) | "segments" should read --segment's-- |
| 12 (Claim 33, | 20 line 1) | "of a edge" should read --of an edge-- |

UNITED STATES PATENT AND TRADEMARK OFFICE
CERTIFICATE OF CORRECTION

PATENT NO. : 7,434,199 B2
APPLICATION NO. : 11/236208
DATED : October 7, 2008
INVENTOR(S) : N. B. Cobb et al.

It is certified that error appears in the above-identified patent and that said Letters Patent is hereby corrected as shown below:

| COLUMN | LINE | ERROR |
|---|---|---|
| 12 (Claim 34, | 24 line 1) | "of a edge" should read --of an edge-- |

Signed and Sealed this

Seventh Day of July, 2009

JOHN DOLL
*Acting Director of the United States Patent and Trademark Office*

United States Patent
Cobb et al.

(10) Patent No.: US 7,434,199 B2
(45) Date of Patent: Oct. 7, 2008

(54) DENSE OPC

(76) Inventors: Nicolas Bailey Cobb, 1496 Flamingo Way, Sunnyvale, CA (US) 94087; Dragos Dudau, 19500 Pruneridge Ave., Apt. 3209, Cupertino, CA (US) 95014

(*) Notice: Subject to any disclaimer, the term of this patent is extended or adjusted under 35 U.S.C. 154(b) by 401 days.

(21) Appl. No.: 11/236,208

(22) Filed: Sep. 27, 2005

(65) Prior Publication Data
US 2007/0074143 A1  Mar. 29, 2007

(51) Int. Cl.
*G06F 17/50* (2006.01)
(52) U.S. Cl. .................. 716/21; 716/7; 716/19
(58) Field of Classification Search .......... 716/21, 716/19, 7; 430/5; 700/120, 121; 378/35
See application file for complete search history.

(56) References Cited

U.S. PATENT DOCUMENTS

| | | |
|---|---|---|
| 4,532,650 A | 7/1985 | Wihl et al. |
| 4,762,396 A | 8/1988 | Dumant et al. |
| 5,502,654 A | 3/1996 | Sawahata |
| 5,655,110 A | 8/1997 | Krivokapic et al. |
| 5,699,447 A | 12/1997 | Alumot et al. |
| 5,723,233 A | 3/1998 | Garza et al. |
| 5,825,647 A | 10/1998 | Tsudaka |
| 5,879,844 A | 3/1999 | Yamamoto et al. |
| 5,991,006 A | 11/1999 | Tsudaka |
| 6,016,357 A | 1/2000 | Neary et al. |
| 6,049,660 A | 4/2000 | Ahn et al. |
| 6,077,310 A | 6/2000 | Yamamoto et al. |
| 6,120,952 A | 9/2000 | Pierrat et al. |
| 6,128,067 A | 10/2000 | Hashimoto |
| 6,187,483 B1 | 2/2001 | Capodieci et al. |
| 6,243,855 B1 | 6/2001 | Kobayashi et al. |
| 6,249,904 B1 | 6/2001 | Cobb |
| 6,263,299 B1 | 7/2001 | Aleshin et al. |
| 6,269,472 B1 | 7/2001 | Garza et al. |
| 6,301,697 B1 | 10/2001 | Cobb |
| 6,317,859 B1 | 11/2001 | Papadopoulou |
| 6,370,679 B1 | 4/2002 | Chang et al. |

(Continued)

FOREIGN PATENT DOCUMENTS

| | | |
|---|---|---|
| JP | 09319067 A | 12/1997 |

(Continued)

OTHER PUBLICATIONS

Cobb, N., and Y. Granik, "Model-Based OPC Using the MEEF Matrix," *Proceedings of SPIE, vol. 4889: 22nd Annual BACUS Symposium on Photomask Technology*, Monterey, Calif., Sep. 30-Oct. 4, 2002, p. 147.

(Continued)

*Primary Examiner*—Sun J Lin
(74) *Attorney, Agent, or Firm*—Christensen O'Connor Johnson Kindness PLLC

(57) ABSTRACT

A method of calculating process conditions for performing optical and process correction (OPC) or other resolution enhancement techniques on a layout design. Process conditions are estimated on a layout database on a substantially uniform grid. Contour curves are created from the estimated process conditions. The contour curves are then compared against the features in the layout to determine edge placement errors. From the edge placement errors, OPC or other corrections for the features can be made.

35 Claims, 6 Drawing Sheets

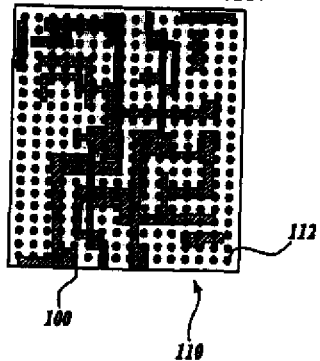

90nm SPARSE SIMULATION

45nm SPARSE SIMULATION

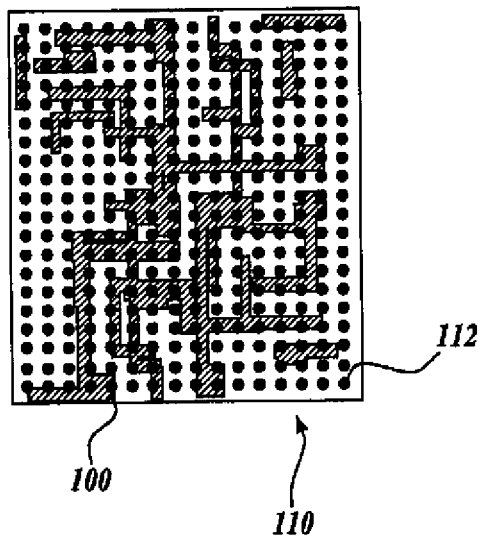
*Fig.3A.*
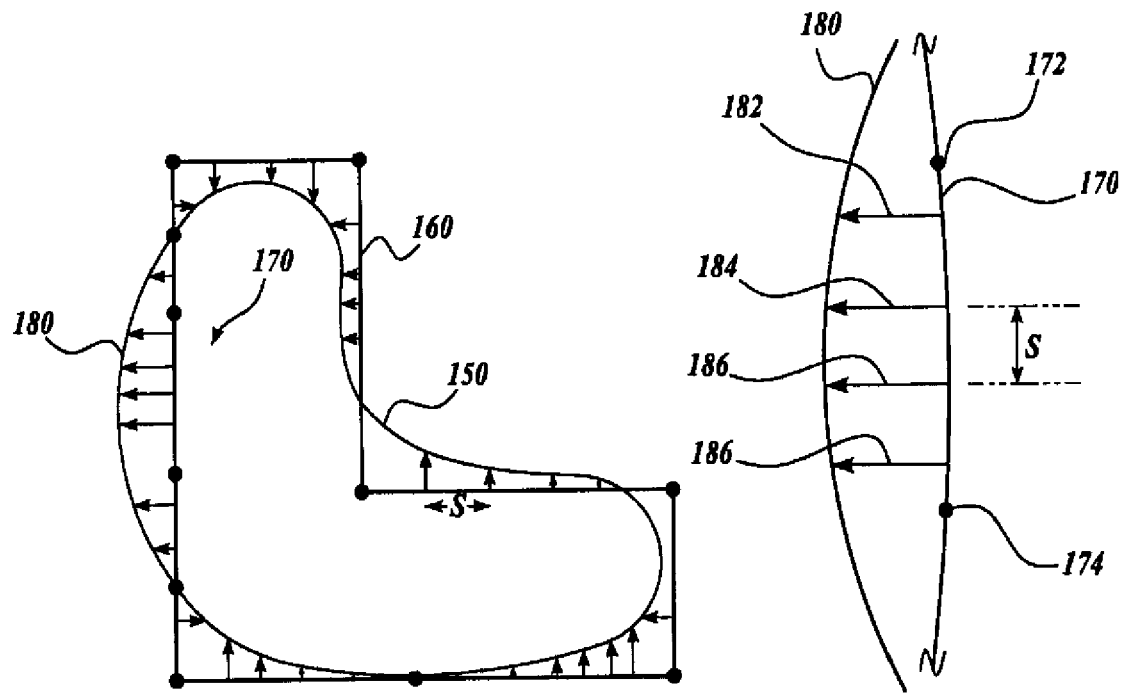
*Fig.3B.*   *Fig.3C.*